(12) United States Patent
Kawanaka et al.

(10) Patent No.: US 6,303,048 B1
(45) Date of Patent: Oct. 16, 2001

(54) LANGASITE-TYPE CRYSTALS AND A METHOD FOR MANUFACTURING THE SAME

(75) Inventors: Hiroyuki Kawanaka, Yokohama; Tsuguo Fukuda, Sendai, both of (JP)

(73) Assignee: Victor Company of Japan, Ltd., Yokohama (JP)

( * ) Notice: Subject to any disclaimer, the term of this patent is extended or adjusted under 35 U.S.C. 154(b) by 0 days.

(21) Appl. No.: 09/268,949

(22) Filed: Mar. 16, 1999

(30) Foreign Application Priority Data

Mar. 17, 1998 (JP) .................................................. 10-088198
May 25, 1998 (JP) .................................................. 10-142800

(51) Int. Cl.$^7$ ........................... C04B 55/495; H01L 41/18
(52) U.S. Cl. .......................................... 252/62.9; 310/311
(58) Field of Search ............................ 252/62.9; 310/311

(56) References Cited

PUBLICATIONS

Fukuda et al "Growth of New Langasite Single Crystals..." Proc. IEEE Int. Symp. Appl. Ferroelectric 11th (1998) pp. 315–319.*

Hyoung Jung et al "Crystal Growth & Piezoelectric Properties of Langasite..." Mater. Lett. (1999) 41(5), 241–246 (Abstract Only).*

Bohm et al "(Zochrelski Growth and Characterization of Piezoelectric Single Crystals..." *Journal of Crystal Growth*, 204(Jul. 1999) pp. 128–136.*

B.V. Mill et al., "Modified rare–earth gallates with a $Ca_3Ga_2Ge_4O_{14}$ structure", *Sov. Phys. Dokl.*, 27(6), pp. 434–437 (Jun. 1982).

H. Kawanaka et al., "Growth and characterization of $La_3Ta_{0.5}Ga_{5.5}O_{14}$ single crystals", *Journal of Crystal Growth*, 183, pp. 274–277 (Jan. 1998).

* cited by examiner

*Primary Examiner*—Mark Kopec
(74) *Attorney, Agent, or Firm*—Anderson, Kill & Olick, P.C.

(57) ABSTRACT

A melt containing lanthanum oxide, tantalum oxide, and gallium oxide is prepared by mixing the powders of these oxides so as to have a stoichiometric composition ratio of an intended lanthanum/tantalum/gallium oxide to be manufactured. A crystal is pulled up from the melt in an atmosphere containing argon and oxygen according to the Czochralski process. The concentration of the oxygen is in a range from 0.1 vol % to 1.5 vol % with respect to the concentration of the argon.

1 Claim, 2 Drawing Sheets

LANGASITE-TYPE CRYSTALS AND A METHOD FOR MANUFACTURING THE SAME

BACKGROUND OF THE INVENTION

The present invention relates to piezoelectric optical materials and more particularly to Langasite-type crystals and the method for manufacturing these crystals.

Recent development of digital communications devices and demands for them are remarkable. The system for the recent mobile communications, including portable telephones and personal handy phones, has been rapidly expanding. In such a digitalized communications field, an improvement of performance in filters and oscillators incorporated in communications devices is very important.

Piezoelectric crystals are excellent electronic components and their properties are preferably used in the filters and oscillators of the communications devices. For example, the quartz is used in SAW (i.e., surface acoustic wave) filters of the portable telephones, and $LiTaO_3$ is used in TV or VTR (or VCR) filters.

The quartz is robust against temperature change, however its band width is narrow. On the contrary, the $LiTaO_3$ is weak against temperature change but its band width is wide.

Therefore, the recent research and development is directed to new materials which possess the excellent properties of both the quartz and the $LiTaO_3$. Namely, the newly developed materials will be small in the frequency change when the temperature changes, stable in the oscillation, wide in the band width, and small in the insertion loss.

Among the conventionally developed crystals, $\alpha$-$AlPO_4$ is not suitable for the industrialized manufacturing due to generation of twin crystals and $Li_2B_4O_7$ is deliquescent and low in the growth speed.

SUMMARY OF THE INVENTION

An object of the present invention is to provide excellent Langasite-type crystals having no coloring problems and free from inclusions and cracks. Furthermore, the present invention relates to the method for manufacturing the Langasite-type crystals.

In order to accomplish the above and other related objects, the present invention provides a method for manufacturing a Langasite-type crystal according to the Czochralski process. In this manufacturing method, a melt containing lanthanum oxide, tantalum oxide, and gallium oxide is prepared by mixing the powders of these oxides so as to have a stoichiometric composition ratio of an intended lanthanum/tantalum/gallium oxide to be manufactured. A crystal is pulled up from the melt stored in a crucible in an atmosphere of the mixture of argon and oxygen gases.

Preferably, the concentration of the oxygen is in a range from 0.1 vol % to 1.5 vol % with respect to the concentration of the argon.

Preferably, the lanthanum oxide, the tantalum oxide, and the gallium oxide are mixed to satisfy the following relationship:

$33.14 \leq X \leq 33.41$, $5.24 \leq Y \leq 5.73$, $61.02 \leq Z \leq 61.45$, and $X+Y+Z=100$ where X, Y and Z represent the molecular percentages (mol %) of the lanthanum oxide, tantalum oxide, and gallium oxide in the melt, respectively.

Another aspect of the present invention provides a Langasite-type crystal manufactured from a melt containing lanthanum oxide, tantalum oxide, and gallium oxide which are mixed to have a mixing ratio of X:Y:Z defined by the following relationship:

$33.14 \leq X \leq 33.41$, $5.24 \leq Y \leq 5.73$, $61.02 \leq Z \leq 61.45$, and $X+Y+Z=100$ where X, Y and Z represent the molecular percentages (mol %) of the lanthanum oxide, the tantalum oxide, and the gallium oxide in the melt, respectively.

BRIEF DESCRIPTION OF THE DRAWINGS

The above and other objects, features and advantages of the present invention will become more apparent from the following detailed description which is to be read in conjunction with the attached drawings, in which.

DESCRIPTION OF THE PREFERRED EMBODIMENT

Figure 1:
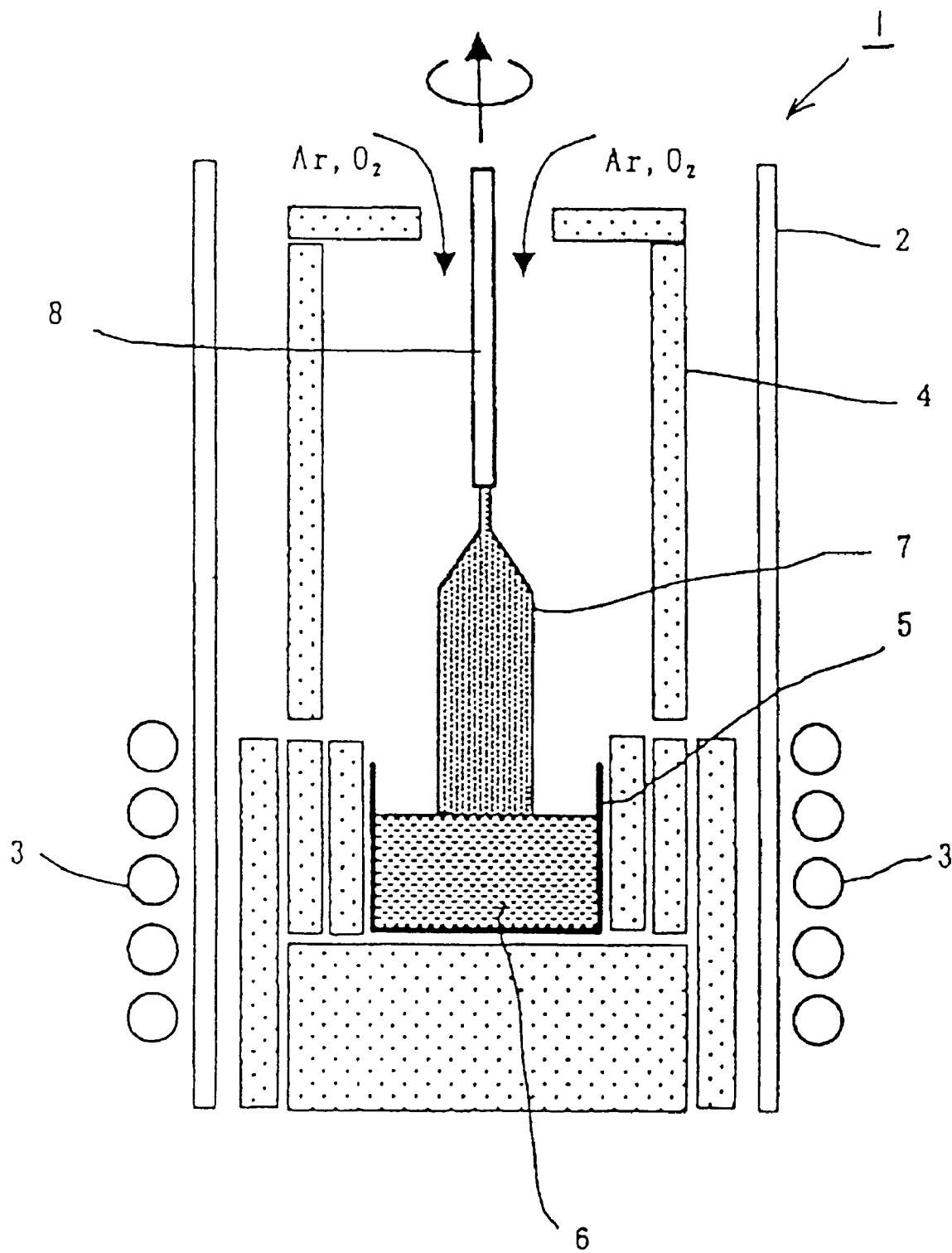
FIG. 1 is a cross-sectional view showing a Czochralski furnace used for manufacturing the Langasite-type crystal in accordance with a preferred embodiment of the present invention.

Langasite-type crystals, represented by $La_3Ga_5SiO_{14}$, $La_3Nb_{0.5}Ga_{5.5}O_{14}$, and $La_3Ta_{0.5}Ga_{5.5}O_{14}$, have preferable properties equivalent to the superior properties of the quartz and $LiTaO_3$ and are easy to manufacture the crystal. Therefore, the Langasite-type crystals are prospective as piezoelectric optical materials.

The Langasite-type crystals are manufactured by the Czochralski process according to which a melt containing La (lanthanum), Ga (gallium), Ta (tantalum), and O (oxygen) is prepared and then a seed crystal is slowly pulled up from the melt in an oxygen atmosphere.

Enlarging the crystal size is inevitably required in the manufacturing of an electronic component such as a SAW filter. Accordingly, various research and developments should be done for optimizing the manufacturing conditions of the Langasite-type crystals.

For example, in the manufacturing of $La_3Ga_5SiO_{14}$, $La_3Nb_{0.5}Ga_{5.5}O_{14}$, and $La_3Ta_{0.5}Ga_{5.5}O_{14}$, the parameters to be optimized include the pulling-up speed of the crystal, the rotating speed of the crystal, the temperature gradient in the melt, composition of the melt, material of a crucible storing the melt, and atmospheric gas used for the crystal growth.

However, the color of these Langasite-type crystals tend to turn into an orange or red color during their manufacturing processes. Such a coloring phenomenon is undesirable because the optical properties, e.g., refractive index, are worsened. The coloring is believed to come from impurities added to the Langasite-type crystal or from the lattice defect and/or dislocation caused during the manufacturing of the crystal.

The atmosphere including oxygen is used to suppress the vaporization of Ga contained in the melt in the manufacturing of the Langasite-type crystals.

Such a vaporization of Ga from the melt will vary the composition of the melt, causing the dispersion in the composition. The manufactured Langasite-type crystals will not be free from the inclusions or cracks.

Accordingly, it is essentially important to use the oxygen atmosphere for manufacturing the Langasite-type crystals.

However, the above-described coloring phenomenon of the Langasite-type crystals is caused by excessively increasing the oxygen concentration.

In the manufacturing of the Langasite-type crystals, the composition of the melt should be equalized to a congruent melting composition corresponding to the composition of the crystal to be manufactured. If the composition of the melt is different from the congruent melting composition, the composition of the melt will vary in accordance with the progress of crystallization. Thus, it becomes difficult to obtain an intended single crystal.

For example, the congruent melting composition for the $LiNbO_3$ is not given by $Li_2O:Nb_2O=50:50$, and should be adjusted to $Li_2O:Nb_2O=48.3:51.7$.

By adjusting the composition of the melt to the congruent melting composition, the composition of the melt is optimized without fluctuating or deviating. This is advantageous to obtain a large-size $LiNbO_3$ single crystal.

In the manufacturing of the Langasite-type crystals, optimization of the composition of the melt is very important. The difference between the melt composition and the manufactured crystal component will invite the inclusions or cracks in the crystal as well as the dispersion in the composition. Thus, the yield will be worsened in the production of the devices, such as SAW filters.

Hereinafter, a preferred embodiment of the present invention will be explained with reference to the attached drawings.

The Langasite-type crystals are generally manufactured by the Czochralski process.

FIG. 1 shows a high-frequency induction furnace type Czochralski furnace 1. A high-frequency heater coil 3 is wound along the outer cylindrical wall of a quarts tube 2. A crucible 5, surrounded by multi-layered cylindrical thermal insulating tubes 4, is disposed in the quarts tube 2. The crucible 5, made of iridium (Ir), is filled with a melt 6. The upper end of the high-frequency heater coil 3 wound around the quartz tube 2 is substantially identical with the upper end of the crucible 5. An inner diameter of the crucible 5 is approximately two times the diameter of a crystal 7 to be manufactured. A pulling-up rod 8, hanged at an upper center of the quarts tube 2, is shiftable in the up-and-down direction and rotatable about its axis. The crystal 7 is slowly pulled up from the crucible 5 by the pulling-up rod 8 which is moving upward at a constant speed and is rotating at a constant speed.

When the crystal 7 is $La_3Ta_{0.5}Ga_{5.5}O_{14}$ (abbreviated the LTG crystal, hereinafter), it is manufactured in the following manner.

First, the melt 6 is prepared in the following manner.

Powders of lanthanum oxide ($La_2O_3$), tantalum oxide ($Ta_2O_5$), and gallium oxide ($Ga_2O_3$), whose purity is in the level of 99.99%, are mixed to have a mixing ratio equal to or closer to the stoichiometric composition ratio of the LTG crystal 7 to be manufactured. The mixed powder is further subjected to the mixing and grinding by a ball mill for several days. The obtained powder is then transferred into the crucible 5. As the volume of the mixed and grinded powder is fairly increased, it is preferable to divide the powder into small quantities and successively transfer them into the crucible 5. Then, the powder in the crucible 5 is heated at approximately 1,500° C. to form the melt 6.

Next, a seed crystal of the LTG crystal 7 is fixed to the lower end of the pulling-up rod 8 and soaked into the melt 6 for a while.

Then, the gas mixture containing argon (Ar) and oxygen ($O_2$) is introduced to the space above the crucible 5 in the quarts tube 2. The Ar gas is an inert gas having the purity of a 99.998% level. The flow amount of the Ar gas is 1 l/min while the flow amount of oxygen is 0~20 ml/min. The Ar gas can be replaced by other inert gas, such as nitrogen ($N_2$) gas.

The pulling-up rod 8 is raised upward while it is rotating at a rotational speed of 10 rpm~20 rpm, so that the seed crystal moves upward at a very slow lift speed of 1~3 mm/h.

A large-scale LTG crystal 7, produced by using the crystal growth method of the Czochralski process, is approximately 24 mm in diameter and approximately 145 mm in length.

The material of the crucible 5 is not limited to Ir and therefore can be replaced by other material, such as platinum (Pt).

The following is the evaluation of characteristic properties on several samples of the LTG crystal 7 which are produced in accordance with the above-described manufacturing method.

TABLE 1

| sample No. | 1 | 2 | 3 | 4 | 5 |
|---|---|---|---|---|---|
| concentration ratio γ ($=O_2/Ar$) [vol %] | 0.0 | 0.1 | 0.5 | 1.0 | 2.0 |
| coloring of crystal | nothing | nothing | nothing | nothing | dark orange |
| inclusions | many | nothing | nothing | nothing | nothing |
| cracks | many | nothing | nothing | nothing | nothing |
| overall evaluation | X | ○ | ○ | ○ | X |

Table 1 shows the evaluation result of five samples 1~5 of the LTG crystal 7 which are different in the concentration ratio of the oxygen to the argon.

The concentration ratio γ ($=O_2/Ar$) shown in the table 1 is a ratio of the oxygen flow amount to the argon flow amount, represented by the units of vol %.

The concentration ratio γ ($=O_2/Ar$) of the samples 1~5 varies in the range from 0 vol % to 2.0 vol %. Other manufacturing conditions are same for each of the samples 1~5.

The sample 1 is the LTG crystal 7 manufactured under the atmospheric condition where no oxygen gas is mixed with the argon gas.

In this case, the size of the obtained LTG crystal 7 is approximately 24 mm in diameter and approximately 130 mm in the length. Its crystallization rate is approximately 60%. The crystallization rate is defined by a weight ratio of the LTG crystal 7 to the melt 6 in the crucible 5. In other words, when all of the melt 6 is used to form the LTG crystal 7, its crystallization rate is 100%. Thus, in the case of the sample 1, approximately 60% of the melt 6 is crystallized.

The sample 1 remains colorless and transparent, without causing any coloring. However, when the crystallization rate is within the range of 50% to 60%, many inclusions are produced. This is believed that the composition of the melt 6 is changed due to the vaporization of Ga. It is confirmed from the X-ray diffraction inspection that the produced inclusions are the $LaGaO_3$ phase. The surface of the sample 1 is undulated with many wrinkles some of which have triggered the cracks.

In view of the foregoing, the sample 1 is improper as a piezoelectric material because it has many inclusions and cracks.

The sample 2 is the LTG crystal 7 manufactured under the atmospheric condition where the concentration ratio of the oxygen to the argon gas (i.e., γ) is 0.1 vol %.

In this case, the size of the obtained LTG crystal 7 is approximately 24 mm in diameter and approximately 140 mm in the length. Its crystallization rate is approximately 65%.

The sample 2 remains colorless and transparent, without causing any coloring and inclusions. No cracks are observed, although the surface of the sample 2 is slightly undulated with small wrinkles.

In view of the foregoing, the sample 2 is proper as a piezoelectric material because it has no coloring, no inclusions and no cracks.

The sample 3 is the LTG crystal 7 manufactured under the atmospheric condition where the concentration ratio of the oxygen to the argon gas (i.e., $\gamma$) is 0.5 vol %.

In this case, the size of the obtained LTG crystal 7 is approximately 24 mm in diameter and approximately 145 mm in the length. Its crystallization rate is approximately 67%.

The sample 3 remains colorless and transparent, without causing any coloring. No cracks and inclusions are observed. The surface of the sample 3 is smooth with no wrinkles.

In view of the foregoing, the sample 3 is proper as a piezoelectric material because it has no coloring, no inclusions and no cracks.

The sample 4 is the LTG crystal 7 manufactured under the atmospheric condition where the concentration ratio of the oxygen to the argon gas (i.e., $\gamma$) is 1.0 vol %.

In this case, the size of the obtained LTG crystal 7 is approximately 24 mm in diameter and approximately 145 mm in the length. Its crystallization rate is approximately 67%.

The sample 4 remains colorless and transparent, without causing any coloring. No cracks and inclusions are observed. The surface of the sample 4 is smooth with no wrinkles.

In view of the foregoing, the sample 4 is proper as a piezoelectric material because it has no coloring, no inclusions and no cracks.

The sample 5 is the LTG crystal 7 manufactured under the atmospheric condition where the concentration ratio of the oxygen to the argon gas (i.e., $\gamma$) is 2.0 vol %.

In this case, the size of the obtained LTG crystal 7 is approximately 24 mm in diameter and approximately 140 mm in the length. Its crystallization rate is approximately 65%.

The sample 5 has coloring of dark orange, although no cracks and no inclusions are observed. It is believed that the excessive oxygen in the gas mixture has caused the crystal defect or dislocation in the LTG crystal 7.

In view of the foregoing, the sample 5 is improper as a piezoelectric material because it has the coloring problem.

Accordingly, it is confirmed that a preferable piezoelectric material having no coloring and no cracks or inclusions is obtained by manufacturing the LTG crystal 7 under the atmospheric condition where the concentration ratio of the oxygen to the argon gas (i.e., $\gamma$) is in the range from 0.1 vol % to 1.5 vol %.

Next, an optimum range of the congruent melting composition of the melt will be explained with reference to the following table 2 and FIG. 2, for the manufacturing of the LTG crystal which is monocrystallized in all of the crystal region.

The table 2 shows a relationship between the composition of the monocrystal region of the LTG crystal and the mixing ratio of the melt.

Figure 2:
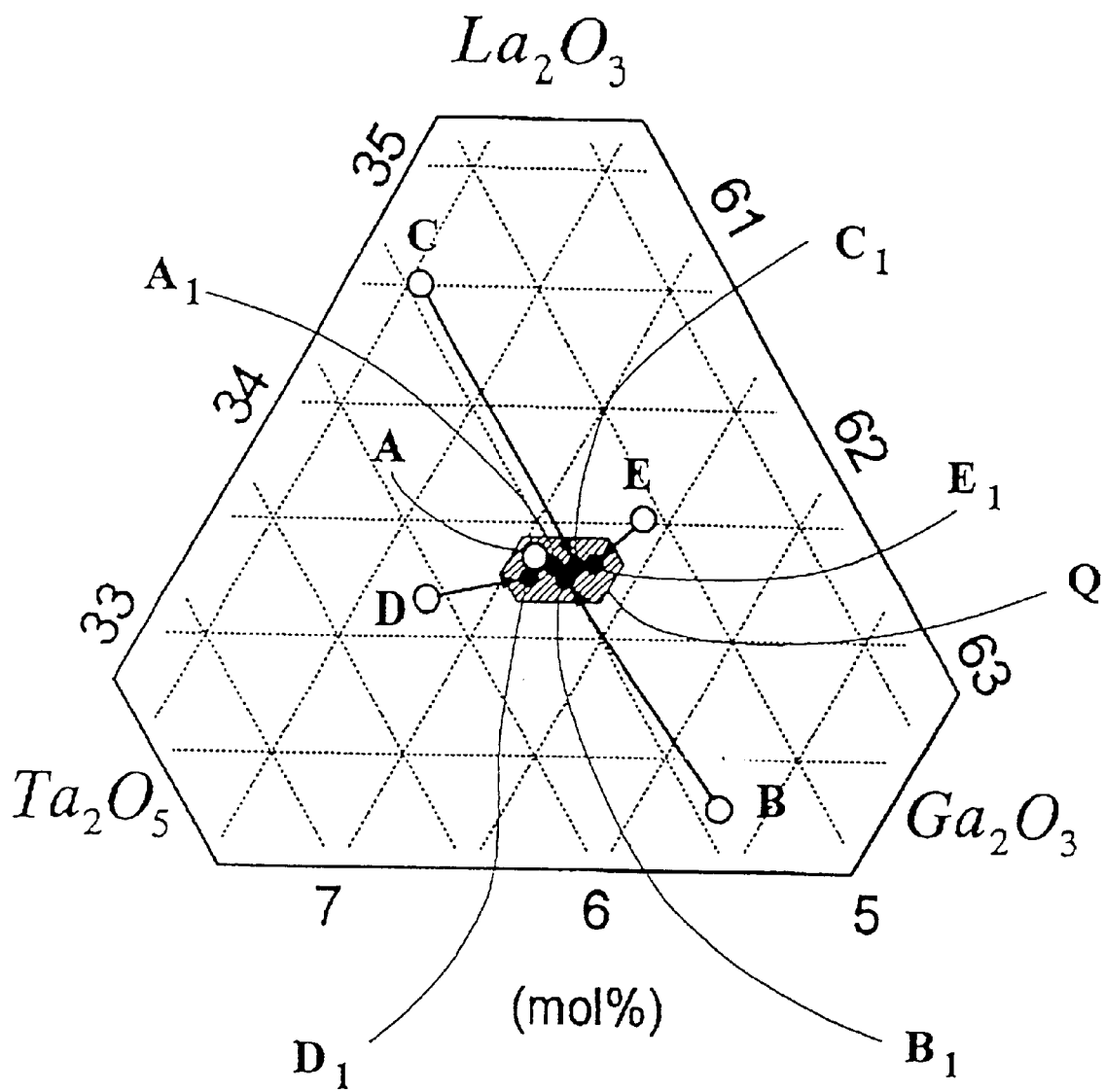
FIG. 2 is ternary composition diagram showing the relationship between the monocrystal region of the manufactured crystal and the mixing ratio of the melt in accordance with the preferred embodiment of the present invention.

FIG. 2 is a ternary composition diagram showing the relationship between the composition of the monocrystal region of the LTG crystal and the mixing ratio of the melt.

TABLE 2

| sample No. of melt | | A | B | C | D | E |
|---|---|---|---|---|---|---|
| mixing ratio of melt (mol %) | $La_2O_3$ | 33.33 | 32.26 | 34.50 | 33.16 | 33.51 |
| | $Ta_2O_5$ | 5.56 | 5.38 | 5.46 | 6.06 | 5.06 |
| | $Ga_2O_3$ | 61.11 | 62.36 | 60.04 | 60.79 | 61.43 |
| sample No. of LTG crystal | | $A_1$ | $B_1$ | $C_1$ | $D_1$ | $E_1$ |
| composition of LTG crystal (mol %) | $La_2O_3$ | 33.29 | 33.24 | 33.30 | 33.25 | 33.31 |
| | $Ta_2O_5$ | 5.52 | 5.49 | 5.42 | 5.63 | 5.34 |
| | $Ga_2O_3$ | 61.19 | 61.27 | 61.28 | 61.12 | 61.35 |

In the table 2 and FIG. 2, the composition of the LTG crystal and the mixing ratio of the melt are expressed by the units of mol % (molecular percentage). The samples $A_1$, $B_1$, $C_1$, $D_1$ and $E_1$ of the LTG crystal are manufactured by using the samples A, B, C, D and E of the melt, respectively. The mixing ratio of $La_2O_3$, $Ta_2O_5$, and $Ga_2O_3$ in respective melt samples are different in the range of ±1.25 mol % with respect to the stoichiometric composition ratio of the intended LTG crystal to be manufactured.

Regarding the composition values of the LTG crystal samples $A_1$, $B_1$, $C_1$, $D_1$ and $E_1$, their data are measured from the monocrystal region only. FIG. 2 plots the measured composition values. A fluorescent X-ray spectroscopy machine, having the accuracy of +0.1 mol % or less, is used to analyze the composition (i.e., composition ratio among $La_2O_3$, $Ta_2O_5$ and $Ga_2O_3$) of respective LTG crystal samples $A_1$, $B_1$, $C_1$, $D_1$ and $E_1$.

The stoichiometric composition ratio of the LTG crystal is given as follows:

$$La_2O_3:Ta_2O_5:Ga_2O_3=33.33:5.56:61.11$$

Thus, the optimum range of the congruent melting composition is checked by comparing each mixing ratio of the melt with the resultant composition of the LTG crystal.

The LTG crystal sample $A_1$ is manufactured from the melt sample A whose mixing ratio is $La_2O_3:Ta_2O_5:Ga_2O_3=$ 33.33:5.56:61.11.

The size of the LTG crystal sample $A_1$ is approximately 24 mm in diameter and approximately 165 mm in length. Its crystallization rate is approximately 99%.

The obtained single crystal is colorless and transparent and has no cracks, when the crystallization rate is in the range from 0% to 78%. As a result of the fluorescent X-ray spectroscopic analysis, the composition in the monocrystal region is confirmed as $La_2O_3:Ta_2O_5:Ga_2O_3=$ 33.29:5.52:61.19.

The LTG crystal sample $B_1$ is manufactured from the melt sample B whose mixing ratio is $La_2O_3:Ta_2O_5:Ga_2O_3=$ 32.26:5.38:62.36.

The size of the LTG crystal sample $B_1$ is approximately 24 mm in diameter and approximately 160 mm in length. Its crystallization rate is approximately 92%.

The obtained single crystal is colorless and transparent and has no cracks, when the crystallization rate is in the range from 0% to 10%. As a result of the fluorescent X-ray spectroscopic analysis, the composition in the monocrystal region is confirmed as $La_2O_3:Ta_2O_5:Ga_2O_3=$ 33.24:5.49:61.27.

The LTG crystal sample $C_1$ is manufactured from the melt sample C whose mixing ratio is $La_2O_3:Ta_2O_5:Ga_2O_3=$ 34.50:5.46:60.04.

The size of the LTG crystal sample $C_1$ is approximately 24 mm in diameter and approximately 140 mm in length. Its crystallization rate is approximately 78%.

The obtained single crystal is colorless and transparent and has no cracks, when the crystallization rate is in the range from 0% to 14%. As a result of the fluorescent X-ray spectroscopic analysis, the composition in the monocrystal region is confirmed as $La_2O_3:Ta_2O_5:Ga_2O_3$= 33.30:5.42:61.28.

The LTG crystal sample $D_1$ is manufactured from the melt sample D whose mixing ratio is $La_2O_3:Ta_2O_5:Ga_2O_3$= 33.16:6.06:60.79.

The size of the LTG crystal sample $D_1$ is approximately 24 mm in diameter and approximately 170 mm in length. Its crystallization rate is approximately 99%.

The obtained single crystal is colorless and transparent and has no cracks, when the crystallization rate is in the range from 0% to 6%. As a result of the fluorescent X-ray spectroscopic analysis, the composition in the monocrystal region is confirmed as $La_2O_3:Ta_2O_5:Ga_2O_3$= 33.25:5.63:61.12.

The LTG crystal sample $E_1$ is manufactured from the melt sample E whose mixing ratio is $La_2O_3:Ta_2O_5:Ga_2O_3$= 33.51:5.06:61.43.

The size of the LTG crystal sample $E_1$ is approximately 24 mm in diameter and approximately 165 mm in length. Its crystallization rate is approximately 99%.

The obtained single crystal is colorless and transparent and has no cracks, when the crystallization rate is in the range from 0% to 5%. As a result of the fluorescent X-ray spectroscopic analysis, the composition in the monocrystal region is confirmed as $La_2O_3:Ta_2O_5:Ga_2O_3$= 33.31:5.34:61.35.

From the foregoing, it is confirmed that the obtained LTG crystal has an excellent monocrystal region when the composition ratio of the melt is within the range of ±1.25 mol % with respect to the stoichiometric composition ratio of the LTG crystal.

The melt has the congruent melting composition when the composition of the melt is equal to the composition of the monocrystal region in the LTG crystal.

The composition of the melt does not fluctuate and agrees with the composition of the LTG crystal. The obtained single crystal has excellent properties in the whole range (from 0% to 100%) of the crystallization rate.

Considering the accuracy (±0.1 mol % or less) of the fluorescent X-ray spectroscopy machine, the measured data of table 2 is plotted on the ternary composition diagram of FIG. 2. A shaded region Q represents the optimum region wherein the melt has the congruent melting molten component.

In other words, by using the melt having the composition corresponding to the optimum region Q, the crystal grows from the congruent melting composition. Thus, it becomes possible to obtain the single crystal having excellent properties free from the inclusions or cracks in the whole range (from 0% to 100%) of the crystallization rate.

From the measured data plotted in the ternary composition diagram, the optimum region Q is defined as follows:

$$33.14 \text{ mol } \% \leq X \leq 33.41 \text{ mol } \%;$$

$$5.24 \text{ mol } \% \leq Y \leq 5.73 \text{ mol } \%;$$

$$61.02 \text{ mol } \% \leq Z \leq 61.45 \text{ mol } \%; \text{ and}$$

$$X+Y+Z=100 \text{ mol } \%$$

where X:Y:Z represents the mixing ratio of $La_2O_3$, $Ta_2O_5$ and $Ga_2O_3$.

Thus, when the LTG crystal is manufactured from the melt having the above-defined mixing ratio, the composition of the resultant LTG crystal agrees with the composition of the melt. The obtained single crystal has excellent properties free from the inclusions and cracks.

In general, when the chemical formula $La_uTa_vGa_wO_{14}$ represents the LTG crystal to be manufactured, the composition values "u", "v" and "w" are in the following ranges:

$$2.9826 \leq u \leq 3.0069;$$

$$0.4716 \leq v \leq 0.5157; \text{ and}$$

$$5.4918 \leq w \leq 5.5305$$

As described above, the LTG crystal $La_uTa_vGa_wO_{14}$ is manufactured from the congruent melting composition, the obtained single crystal has excellent properties in the whole range (from 0% to 100%) of the crystallization rate.

This invention may be embodied in several forms without departing from the spirit of essential characteristics thereof. The present embodiment as described is therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A Langasite crystal having a composition different from a stoichiometric composition and is a colorless and transparent single crystal with no cracks and no inclusions, wherein said Langasite crystal comprises 33.31 mol % lanthanum oxide ($La_2O_3$) 5.34 mol % tantalum oxide ($Ta_2O_5$) and 61.35 mol % gallium oxide ($Ga_2O_3$).

* * * * *